United States Patent
Takahashi et al.

(10) Patent No.: US 6,744,492 B2
(45) Date of Patent: Jun. 1, 2004

(54) EXPOSURE APPARATUS

(75) Inventors: Kazuhiro Takahashi, Tochigi (JP); Yoshiyuki Nagai, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/749,926

(22) Filed: Dec. 29, 2000

(65) Prior Publication Data
US 2001/0015798 A1 Aug. 23, 2001

(30) Foreign Application Priority Data
Jan. 14, 2000 (JP) ........................ 2000-006489

(51) Int. Cl.$^7$ .......................... G03B 27/72; G03B 27/42
(52) U.S. Cl. .......................................... 355/69; 355/53
(58) Field of Search .............................. 355/53, 67–71, 355/77; 356/399–401; 250/205, 492.2, 492.22

(56) References Cited

U.S. PATENT DOCUMENTS

| | | | |
|---|---|---|---|
| 4,825,247 A | 4/1989 | Kemi et al. ................ 355/55 |
| 5,861,944 A * | 1/1999 | Nishi ........................ 355/68 |
| 5,879,845 A | 3/1999 | Takahashi .................. 430/30 |
| 5,892,573 A * | 4/1999 | Takahashi et al. .......... 355/69 |
| 5,925,887 A | 7/1999 | Sakai et al. ................ 250/548 |
| 6,040,894 A | 3/2000 | Takahashi .................. 355/53 |
| 6,115,107 A * | 9/2000 | Nishi ........................ 355/68 |
| 6,163,365 A | 12/2000 | Takahashi .................. 355/53 |
| 6,204,911 B1 * | 3/2001 | Kurosawa et al. .......... 355/53 |
| 6,211,947 B1 * | 4/2001 | Tsuji ......................... 355/67 |
| 6,501,535 B1 * | 12/2002 | Ozawa ....................... 355/68 |

FOREIGN PATENT DOCUMENTS

EP 1 017 086 A1 7/2000
JP WO 98/59364 12/1998

OTHER PUBLICATIONS

U.S. patent application Ser. No. 09/013,201, Takeshi Shiozawa, filed Jan. 26, 1998.

* cited by examiner

Primary Examiner—Henry Hung Nguyen
(74) Attorney, Agent, or Firm—Fitzpatrick, Cella, Harper & Scinto

(57) ABSTRACT

An exposure apparatus includes a light source for emitting exposure light, an illumination optical system illuminating an original on which a pattern is formed by the exposure light emitted from the light source, a projection optical system projecting the pattern to a photosensitive object, a first photodetector, disposed in a portion for receiving light from an optical path between the light source and a portion where the original is placed, for monitoring an emission light amount from the light source, and a processing system. The processing system obtains information regarding light exposure provided to at least an optical element included in one of the illumination optical system and the projection optical system, estimates a change in transmittance of the optical element on the basis of the information obtained and corrects a proportional coefficient for the light amount detected by the first photodetector and the emission light amount from the light source on the basis of the estimated change of transmittance.

6 Claims, 7 Drawing Sheets

EXPOSURE APPARATUS

BACKGROUND OF THE INVENTION

1. Field of the Invention

The present invention relates mainly to an exposure apparatus used for a photolithographic operation in a process for manufacturing ICs, LSIs, or other types of semiconductor devices.

2. Description of the Related Art

To manufacture semiconductor devices, such as ICs and LSIs, by using photolithography, an exposure apparatus is employed in which a reticle (mask) pattern as an original is directly projected, or reduced at a predetermined proportion and projected, onto a photosensitive material applied to a semiconductor wafer or a photosensitive substrate. Most photosensitive materials applied to wafers have established proper light exposures. In a conventional exposure apparatus, a half mirror is disposed in an illumination optical system, and the amount of exposure light branched by the half mirror is monitored by a photodetecting element (a first photodetecting means). Based on a result of the monitoring, the light exposure is controlled to obtain an appropriate light exposure.

With the recent trend toward microminiaturization of semiconductor devices, excimer lasers that emit light in a far ultraviolet ray range are being increasingly employed as light sources of exposure apparatuses. It has been found, however, that repeated use of excimer laser beams gradually changes the optical characteristics of an illumination optical system, optical components, such as a half mirror, and coating films. This is considered to be caused by changes primarily in transmittance or refractive index of the vitreous materials of optical components and coating films, the changes being attributed to their exposure to the excimer laser beams. Therefore, the ratio of the light amount of an excimer laser beam branched by the half mirror to the light amount of an excimer laser beam that reaches a wafer changes accordingly. If the light exposure control is conducted on the assumption that the aforesaid ratio stays constant, then the difference between an actual light exposure and an appropriate light exposure may exceed a predetermined permissible value.

Normally, the amount of light emitted from an excimer laser, which is a light source, is controlled by regulating a voltage corresponding to energy for each pulse from an exposure apparatus, thereby conducting the light exposure control. As the transmittance of an illumination optical system changes, a relationship between the transmittance and a voltage value of an excimer laser determined based on the amount of a laser beam monitored will change accordingly. As the transmittance lowers, a light exposure that has been reduced due to the lowered transmittance will be obtained in relation to a command value. In order to perform accurate light exposure control, if the amount of light of a preceding pulse that reaches a wafer is smaller than a set value, then it is necessary to increase the succeeding pulse energy. This requires a higher voltage to be applied accordingly. If the voltage deviates from a permissible voltage range, then a desired amount of light cannot be obtained, preventing precise light exposure control from being carried out.

As a solution to the problem described above, there has been known the following method. A photodetecting element (a second photodetecting means) and a light transmitting portion through which exposure light passes to a portion other than a transfer pattern, with a mask resting thereon, are disposed in the vicinity of a wafer. A ratio is obtained of an output of the first photodetecting means that monitors the light amount in the aforesaid illumination optical system relative to an output obtained when exposure light is passed through the light transmitting portion and incident upon the second photodetecting means, while the mask is away from an exposure range, and irradiation to the wafer is OFF. By using the ratio, the sensitivity of the first photodetecting means under exposure is corrected, thereby to perform exposure with an appropriate amount of light. At this time, a relationship between a command voltage applied to a light source that is dependent upon the amount of light emitted from the light source and an output of the first photodetecting means can also be corrected.

However, in a vacuum ultraviolet range of a wavelength of 200 nm or less, in particular, the transmittance of a vitreous material changes with the irradiation time. The amount of change ranges from 0.1 to 0.3% per one cm, and gradually eases after completion of the irradiation. The time constant is extremely long, e.g., a few tens of seconds. The change amount of the transmittance depends on the pulse energy or oscillation frequency of a laser serving as a light source, an oscillation duty (ratio of a burst oscillation ON versus an oscillation OFF time), exposure duration, the transmittance of a mask, and the amount of light incident upon an optical component in a unit time in an illumination range. A marked change in transmittance is observed, especially immediately after exposure is begun. For this reason, a change in the transmittance of a vitreous constituent located between the aforesaid first photodetecting means and a photosensitive substrate surface presents a significant problem from a standpoint of accuracy in light exposure control. Recently, the diameters of the wafers are being increased, resulting in longer replacement intervals of the wafers. Hence, it is difficult to maintain an appropriate light exposure control accuracy when the relationship between the first photodetecting means, the second photodetecting means, and the voltage of a light source is corrected each time the wafer is replaced. In addition, making frequent corrections inevitably leads to a lower throughput.

SUMMARY OF THE INVENTION

Accordingly, it is a first object of the present invention to provide an exposure apparatus and an exposure method that each enables a minimized drop in throughput to be achieved and, also a proper light exposure control accuracy to be maintained.

In one aspect, the present invention provides an exposure apparatus that includes a light source, an illumination optical system illuminating an original on which a pattern is formed by the exposure light emitted from the light source, a projection optical system projecting the pattern to a photosensitive object, a first photodetector, disposed in a portion for receiving light from an optical path between the light source and a portion where the original is placed, the first photodetector being used for monitoring an emission light amount from the light source, and a processing system. The processing system obtains information regarding light exposure provided to at least an optical element included in one of the illumination optical system and the projection optical system, estimates a change in transmittance of the optical element on the basis of the information obtained and corrects a proportional coefficient for the light amount detected by the first photodetector and the emission light amount from the light source on the basis of the estimated change of transmittance.

In another aspect, the present invention provides a method for producing devices by use of an exposure apparatus. The method includes steps of illuminating, with an illumination optical system, an original on which a pattern is formed by exposure light from a light source, projecting, with a projection optical system, the pattern to a photosensitive object, receiving light by a first photodetector from an optical path between the light source and a portion where the original is placed, monitoring, by the photodetector, an emission light amount from the light source, obtaining information regarding light exposure provided to at least an optical element included in one of the illumination optical system and the projection optical system, estimating a change in transmittance of at least the optical element on the basis of the information obtained, correcting a proportional coefficient for the light amount detected by the first photodetector and the emission light amount from the light source on the basis of the estimated change of transmittance and developing the photosensitive object with a projected pattern, a circuit device being produced from the developed object. The illuminating step is performed on the basis of the corrected proportional coefficient for the first photodetector.

In yet another aspect, the present invention provides a method for exposing an original and for projecting a pattern formed on the original onto a photosensitive object. The method includes steps of illuminating, with an illumination optical system, the original by exposure light from a light source, projecting, with a projection optical system, the pattern of the original onto the photosensitive object, receiving light by a first photodetector from an optical path between the light source and a portion where the original is placed, monitoring, by the photodetector, an emission light amount from the light source, obtaining information regarding light exposure provided to at least an optical element included in one of the illumination optical system and the projection optical system and correcting a proportional coefficient for the light amount detected by the first photodetector and the emission light amount from the light source on the basis of a change in transmittance. The illumination step is performed by using the corrected proportional coefficient for the first photodetector.

Further objects, features and advantages of the present invention will become apparent from the following description of the preferred embodiments.

DESCRIPTION OF THE PREFERRED EMBODIMENTS

Figure 1:
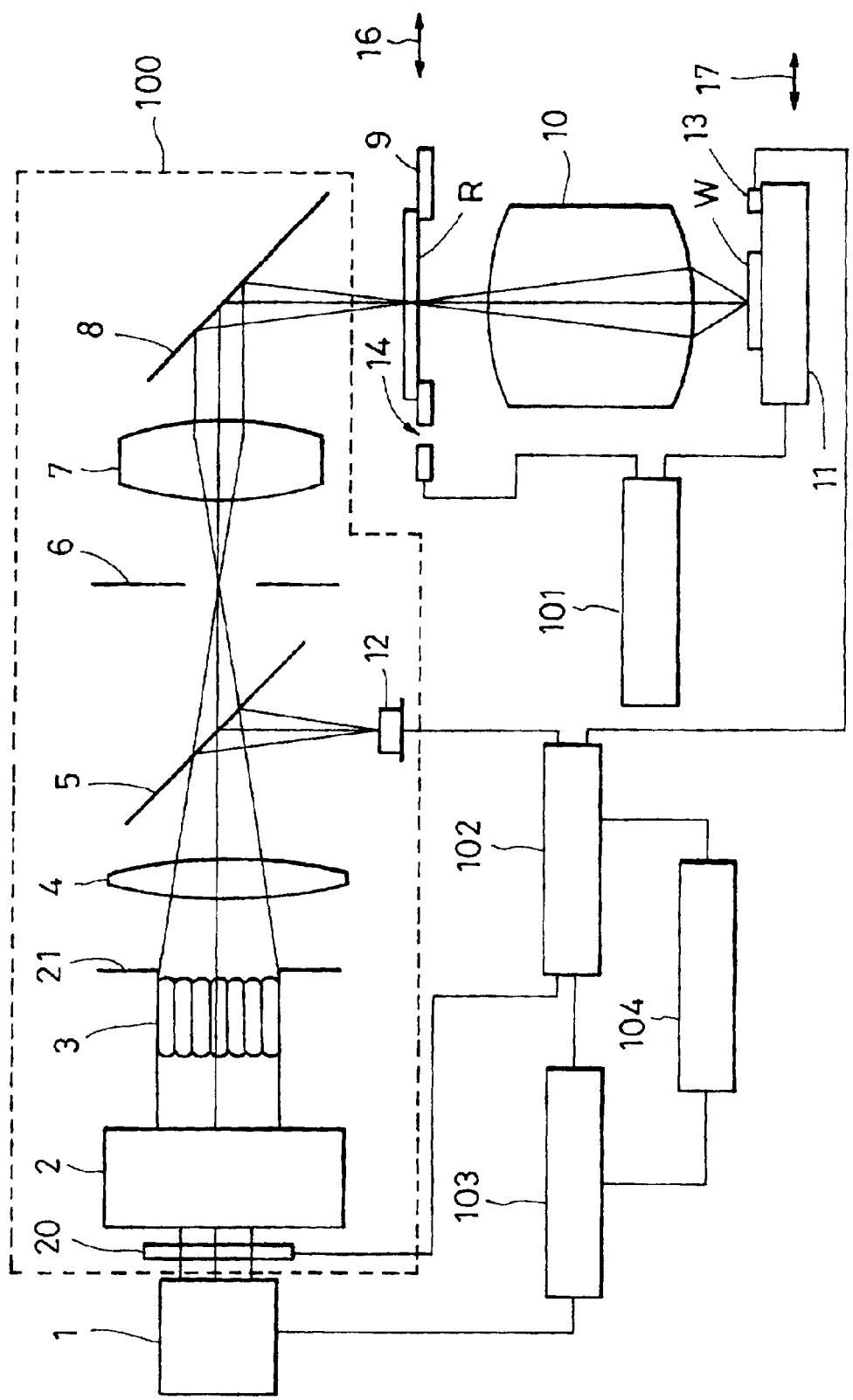
FIG. 1 is a block diagram of an exposure apparatus according to an embodiment of the present invention.

A preferred embodiment of the present invention will be described in detail with reference to the accompanying drawings by taking, as an example, a scanning projection exposure apparatus having a reticle as an original. FIG. 1 is a schematic diagram showing the scanning projection exposure apparatus according to an embodiment of the present invention. The scanning projection exposure apparatus is used to manufacture semiconductor devices, such as ICs and LSIs, liquid crystal devices, imaging devices, such as CCDs, magnetic heads, etc., and is equipped primarily with a beam shaping optical system 2, an optical integrator 3, a condenser lens 4, a half mirror 5, a masking blade 6, an image forming lens 7, a mirror 8, and a light amount detector 12, which is a first photodetecting means. These components make up an illumination optical system 100 for illuminating a reticle R, which is an original, with exposure light emitted from a light source 1. The exposure apparatus further includes a reticle stage 9 serving as an original stage, a projection optical system 10, a wafer stage 11, and an irradiated light amount monitor 13, which is a second photodetecting means.

Referring to FIG. 1, a luminous flux from the light source 1, which is composed of an excimer laser or the like, is transmitted through an ND filter 20 for adjusting transmittance of the luminous flux, which has a predetermined transmittance, and then is shaped into a beam having a desired shape by the beam shaping optical system 2. The shaped beam is directed to a light incident surface of the optical integrator 3, which is composed of a fly-eye lens assembly or the like. The fly-eye lens assembly is composed of a plurality of minute lenses, and has a plurality of secondary light sources in the vicinity of a surface thereof where light exits. An aperture diaphragm 21 determines the magnitude and shape of a secondary light source. The aperture diaphragm 21 is replaced to change a representative value ($\sigma$ value) indicating the magnitude of an illumination extent or to perform oblique incident illumination.

The condenser lens 4 performs Koehler illumination on the masking blade 6 with a luminous flux from a secondary light source of the optical integrator 3. The masking blade 6 and the reticle R, which is the original, are disposed to establish a conjugate relationship by the image forming lens 7 and the mirror 8. The configuration and dimensions of the illumination extent in the reticle R are defined by determining the configuration of the opening of the masking blade 6. The reticle R, on which a transfer pattern has been formed, is lifted by suction by the reticle stage 9. Then, the reticle stage 9 and the reticle R are scanned in the directions indicated by an arrow 16 shown in FIG. 1. The reticle stage 9 is provided with a light transmitting portion 14 for allowing exposure light to pass therethrough. Normally, the illumination extent in the reticle R is shaped like a rectangular slit having its short sides oriented in the scan direction, as indicated by the arrow 16.

The projection optical system 10 reduces and projects the transfer pattern drawn on the reticle R onto a wafer W, which is a photosensitive substrate on which a photosensitive material has been applied. The wafer stage 11 on which the wafer W has been placed is scanned in the directions indicated by an arrow 17 shown in FIG. 1, and moved in a direction perpendicular to the paper surface so as to form an image of the transfer pattern of the reticle R onto each exposure area of the wafer W. A scanning control system 101 carries out control so that the reticle stage 9 and the wafer stage 11 are accurately scanned at a constant speed at the same ratio as the projection magnification of the projection optical system 10 by a driving device (not shown).

The light amount detector 12 monitors the amount of light; it divides a portion of an illumination luminous flux from the condenser lens 4 by the half mirror 5, and monitors the divided luminous flux, thereby indirectly monitoring the light exposure supplied to the wafer W. In the vicinity of the wafer W on the wafer stage 11, there is disposed an irradiated light amount monitor 13, which has its light receiving surface adjusted so as to be substantially flush with the wafer W in order to detect the amount of light on a plane corresponding to a surface of the wafer W.

The light amount detector 12 is disposed to establish a conjugate relationship with the masking blade 6 by the condenser lens 4 and the half mirror 5, and also to establish a conjugate relationship with the exposure surface of the wafer W, that is, the light receiving surface of the irradiated light amount monitor 13. A light amount computing unit 102 processes signals from the light amount detector 12 to determine the output energy of the light source 1 so that the output energy provides a proper amount of light. A light source control system 103 decides a voltage to be applied to the light source 1 in response to a command from the light amount computing unit 102, and controls the output energy of the light source 1.

Furthermore, the exposure apparatus according to this embodiment is provided with a main control system 104 constituting a transmittance change estimating means. The main control system 104 estimates a transmittance change of the optical system in the illumination optical system 100 and a transmittance change of the projection optical system 10 based on a voltage, pulse energy, oscillation frequency, and oscillation duty (ratio of a burst oscillation ON time versus an oscillation OFF time), which are laser oscillating conditions, received from the light source control system 103, and also based on parameters, including the transmittance of the ND filter 20, the transmittance of the reticle R, and the illumination extent of the masking blade 6.

Based on the estimation result, the main control system 104 further estimates a change in the output ratio of the light amount detector 12 to the irradiated light amount monitor 13 and a change in the relationship between the output of the light amount detector 12 and the voltage to be applied to the light source 1, which is decided by the light source control system 103. Based on the estimation result, the main control system 104 constantly corrects the sensitivities of the light amount detector 12 and the irradiated light amount monitor 13, and the relationship between the voltage to be applied to the light source 1 and the output of the light amount detector 12 while an exposure operation is being performed.

Figure 2:
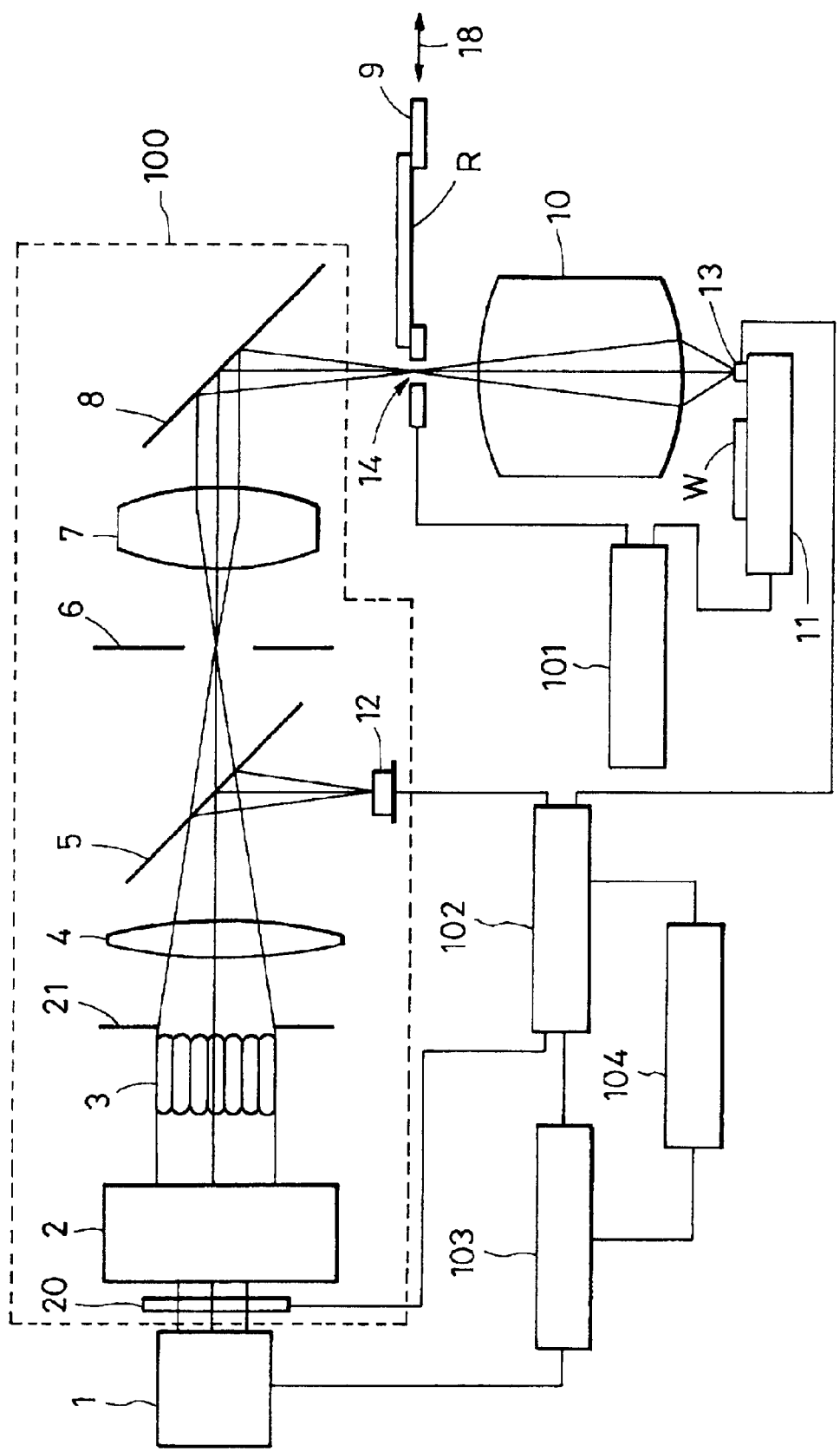
FIG. 2 is a block diagram illustrating a positional relationship when a sensitivity correction is made in the exposure apparatus according to the embodiment of the present invention.

FIG. 2 is a general view of an apparatus demonstrating an example of a positional relationship among the reticle stage 9, the light transmitting portion 14, and the irradiated light amount monitor 13 when the output ratio of the light amount detector 12 to the irradiated light amount monitor 13 is measured. When the main control system 104 issues an instruction for correcting the sensitivities of the light amount detector 12 and the irradiated light amount monitor 13, the reticle stage 9 is driven in the directions indicated by an arrow 18 shown in FIG. 2 by a driving device (not shown) so that the light transmitting portion 14 is positioned on an optical axis of the projection optical system 10. The wafer stage 11 is also driven by a driving device (not shown) so that the irradiated light amount monitor 13 is positioned on the optical axis.

Figure 3:
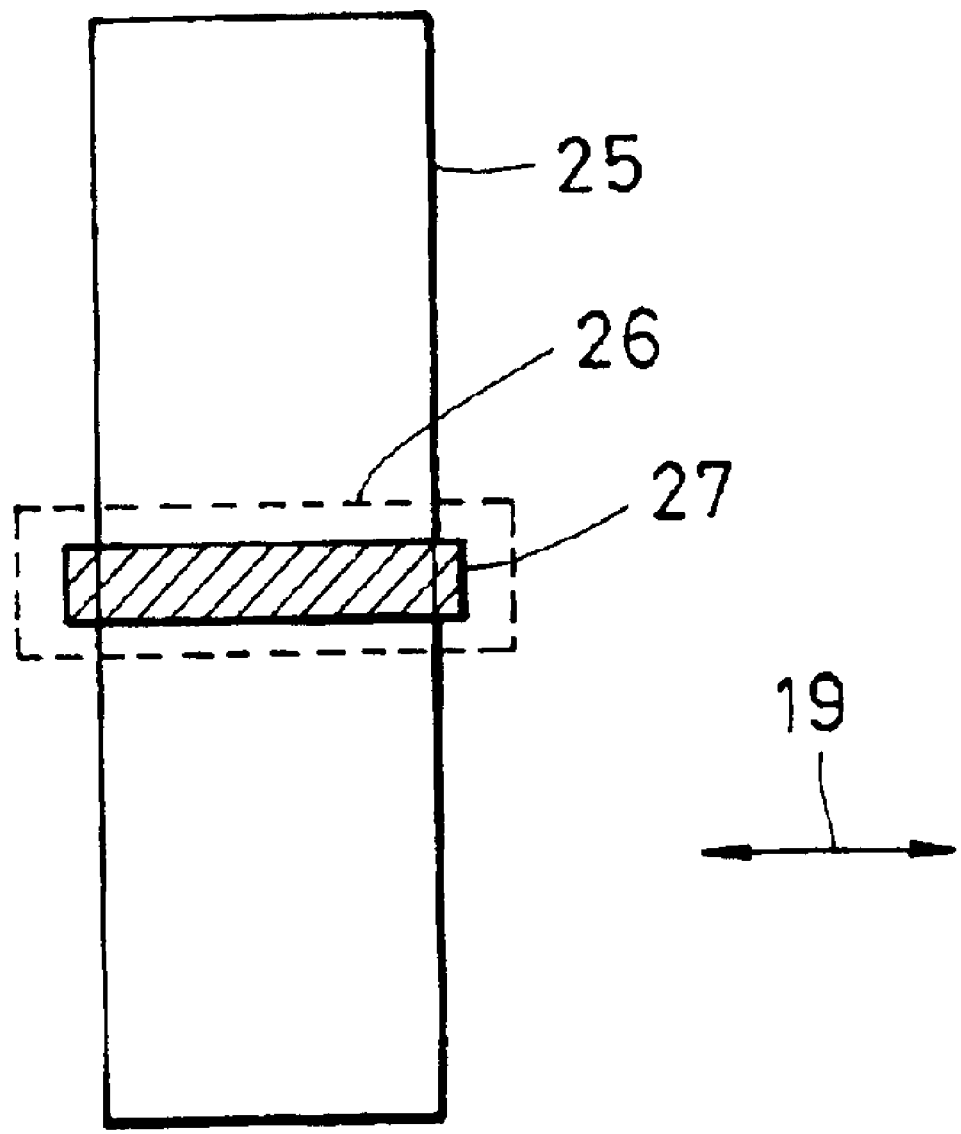
FIG. 3 is a diagram showing a relationship among a light receiving range of an irradiated light amount monitor, a light transmitting extent of a light transmitting portion, and an exposable extent.

FIG. 3 illustrates a relationship between the light receiving surface of the irradiated light amount monitor 13 and a projection image of the transmitting portion 14 of the reticle stage 9, which is formed by the projection optical system 10 when the reticle stage 9 is moved to the position shown in FIG. 2 to perform the measurement of the output ratio of the light amount detector 12 to the irradiated light amount monitor 13. In FIG. 3, an extent defined by the solid line is an exposable extent (illumination extent) 25 illuminated by the illumination optical system 100 and the projection optical system 10. An extent defined by the dashed line indicates a light transmitting extent 26 of the light transmitting portion 14, and a hatched area indicates a light receiving area 27 of the irradiated light amount monitor 13. In the scanning exposure apparatus, the exposable extent 25 is usually a rectangular or arc slit having its short sides oriented in the direction indicated by an arrow 19 shown in FIG. 3.

Preferably, the light receiving extent 27 of the light receiving surface of the irradiated light amount monitor 13 is longer than the exposable extent 25 in a scan direction, while it is sufficiently shorter than the exposable extent 25 in the direction orthogonal to the scan direction. To maintain a uniform exposure amount in the surface of the wafer W during scanning exposure, the light amount integrated in the scanning direction should remain constant in the lengthwise direction orthogonal to the scan direction. Therefore, by measuring the amount of light at each position while moving the irradiated light amount monitor 13 to a plurality of positions in the lengthwise direction, the integrated illuminance (mW/cm) in the scan direction per unit length in the lengthwise direction of the slit can be determined. This makes it possible to measure an illuminance distribution in the lengthwise direction.

Under this condition, the light source 1 shown in FIG. 1 is energized at a predetermined applied voltage V0 by issuing a command from the light source control system 103, and the amounts of light entering the light amount detector 12 and the irradiated light amount monitor 13 are measured. In this example, a signal obtained by the light amount detector 12 is denoted as S0, and a signal obtained by the irradiated light amount monitor 13 is denoted by S1. The signals S0 and S1 have a value that is equivalent to a light amount in a unit time or per pulse on the plane corresponding to a surface of the wafer W or equivalent to an integrated light amount for each predetermined number of pulses when the light source 1 is energized at the applied voltage V0. At initialization or starting of the apparatus, or during periodic maintenance, an absolute illuminometer is mounted on the wafer stage 11 to measure the amount of light and to adjust the sensitivity or gain so as to obtain $(gS0)_{ini}=(fS1)_{ini}=E$, where E denotes the amount of light on the wafer W measured by the absolute illuminometer, and g and f respectively denote gains for converting the output signals S0 and S1 into light amounts.

At the initialization, the relationship between a voltage V applied to the light source 1 and a signal S measured by the light amount detector 12 is adopted to decide an initial value of a coefficient h of a voltage value relative to a command of the light amount computing unit 102, the coefficient h being expressed by h=V/S.

If there is no change in transmittance of the optical system in the illumination optical system 100 and the projection optical system 10, then the product gS0 equals the actual amount of light on the wafer surface. If the transmittance changes, then the product gS0 no longer agrees with the actual amount of light on the wafer surface. To cope with this, the main control system 104 estimates a transmittance change of the optical system in the illumination optical system 100 and the projection optical system 10 from an irradiation amount or optical energy of exposure light entering the optical members during a unit time. The main control system 104 then calculates a correction coefficient 106, which will be a value representing a transmittance change, and corrects the gain so that $g=g_{ini} \times \alpha$ thereby to correct a light exposure setting error, where $g_{ini}$ denotes the gain of the light amount detector 12 in an initialized state wherein no exposure light has been applied. Making the correction enables the amount of light on the wafer W to be accurately estimated based on the output of the light amount detector 12, permitting exposure with an appropriate light exposure to be achieved.

Furthermore, in order to perform proper exposure, it is necessary for the optical light control system 103 to instruct a proper applied voltage to the light source 1 to set pulse energy. If no change takes place in the transmittance in the illumination optical system 100, then the light source control system 103 performs computation of the voltage $V=h \times S$ to obtain an output S that provides a target of the light amount detector 12, and supplies the computation result to the light source 1. If the transmittance of the illumination optical system 100 changes, then a coefficient h' based on the transmittance change from the light source 1 to the light amount detector 12 is determined, and the voltage to be informed to the light source 1 is set by $V=h' \times S$, where h' is calculated by $h'=h \times \beta$. Reference character $\beta$ will be a value representing the transmittance change.

Figure 4:
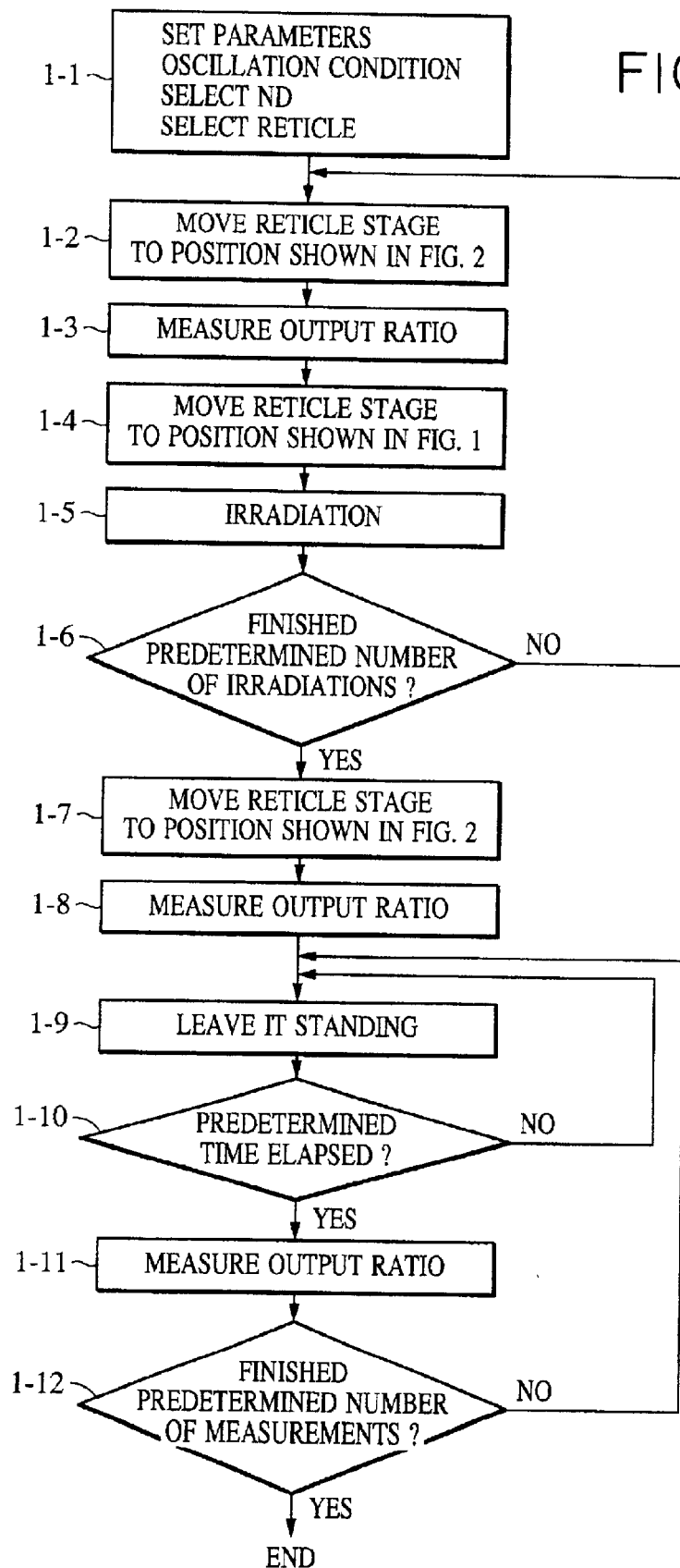
FIG. 4 is a flowchart illustrating a procedure for measuring a relationship between parameters and changes in transmittance by the exposure apparatus shown in FIG. 1.

The following will describe the procedures for determining the correction coefficients $\alpha$ and $\beta$ for each parameter. FIG. 4 is a flowchart illustrating the procedure for the main control system 104 to measure the relationship between parameters related to the amount of irradiation and changes in transmittance in order to estimate transmittance changes in the optical system in the illumination optical system 100 and the projection optical system 10. In step 1-1, the main control system 104 informs the light source control system 103 of the oscillation conditions, such as pulse energy, oscillation frequency, and oscillation duty, of the light source 1, selects a desired ND filter 20, and disposes the reticle R having a desired transmittance on the reticle stage 9. Obviously, measurement related to parameters other than the transmittance of the reticle R can be performed without employing the reticle R. In this example, the reticle stage 9 is moved to the position shown in FIG. 2 (step 1-2), the light source 1 is energized at a predetermined applied voltage V1 according to an instruction given by the light source control system 103, and an output ratio of the light amount detector 12 to the irradiated light amount monitor 13 in the initial stage is measured (step 1-3). Subsequently, in step 1-4, the reticle stage 9 is moved to the position shown in FIG. 1, and irradiation is performed in step 1-5 under set oscillation conditions for a desired unit time. After performing the irradiation for a preset time, the following steps will be repeated until a predetermined number of irradiations is completed (step 1-6). The reticle stage 9 is quickly moved to the position shown in FIG. 2 to return to step 1-2, the light source 1 is energized at the predetermined applied voltage V1 in step 1-3 to measure the output ratio of the light amount detector 12 to the irradiated light amount monitor 13, then the reticle stage 9 is moved to the position shown in FIG. 1 again in step 1-4. In step 1-5, irradiation is carried out under the set oscillation conditions for the desired unit time. This series of steps is repeated for a predetermined number of times, and the changes in the output ratio of the light amount detector 12 to the irradiated light amount monitor 13 with respect to exposure time are stored.

After completing the predetermined number of irradiations (step 1-6), the light source 1 is periodically energized using the applied voltage V1, with the reticle stage 9 moved to the position shown in FIG. 2 (step 1-7), to measure changes in the output ratio of the light amount detector 12 to the irradiated light amount monitor 13 (step 1-8), then they are left standing in step 1-9. When a predetermined time has elapsed in step 1-10, the transmittance change of the optical system in the illumination optical system 100 and the transmittance change in the projection optical system 10 after being left standing are measured in step 1-11. Repeating a predetermined number of measurements (step 1-12) completes the measurement process.

Subsequently, the amount of light incident upon the optical system in the illumination optical system 100 and the projection optical system 10 during the unit time is changed by changing the pulse energy or the oscillation frequency of the light source 1, or by changing the transmittance of the ND filter 20 in the illumination optical system 100, or by replacing the reticle R with one having a different transmittance. Then, under the new condition, the changes in the output ratio of the light amount detector 12 to the irradiated light amount monitor 13 are measured using the method shown in FIG. 4.

Figure 5:
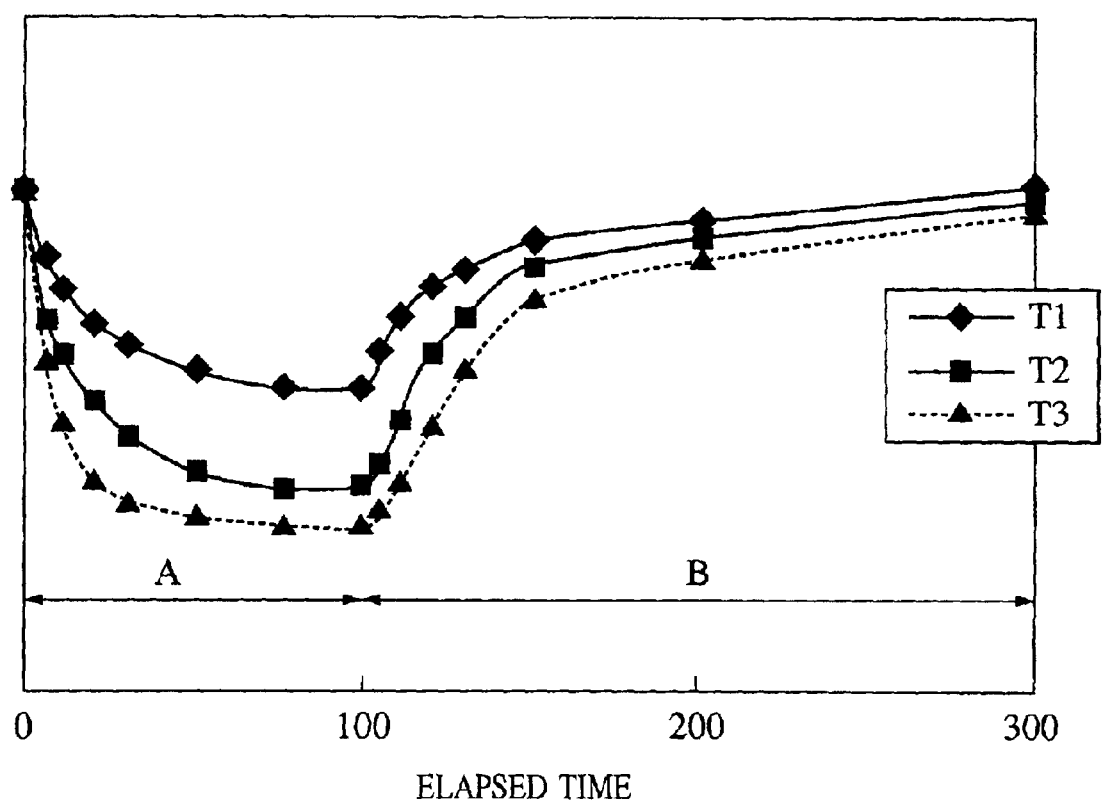
FIG. 5 is a chart showing measurement results of changes in an output ratio obtained by implementing the procedure illustrated by the flowchart of FIG. 4.

FIG. 5 shows the results of the measurement repeated as described above. The exemplary data shown in FIG. 5 indicates the results of measurement that has been performed according to the procedure illustrated in FIG. 4, the measurement being performed at three different transmittances of the ND filter 20, namely, T1, T2, and T3, as a parameter. The axis of the ordinate indicates the output ratio of the irradiated light amount monitor 13 to the light amount detector 12, and the axis of the abscissa indicates elapsed time. On the axis of the abscissa, a range defined by A indicates the duration of irradiation, and a range defined by B indicates a duration wherein the units are left standing. Based on the results, the output S0 of the light amount detector 12 relative to the transmittance of each ND filter 20 is determined, the transmittance of the ND filter 20 being a parameter. Furthermore, a coefficient k1 of the change in the output ratio of the light amount detector 12 to the irradiated light amount monitor 13, and a time constant $\tau 1$ are also calculated based on the above results. From the calculated coefficient and the time constant, the output S0 of the light amount detector 12 within a unit time, and time t, the correction coefficient $\alpha$ of the gain of the light amount detector 12 is computed by $\alpha=f(k1, S0, \tau 1, t, \alpha')$, where t denotes the time elapsed from the moment the preceding correction coefficient was calculated, f denotes a function for computing the correction coefficient $\alpha$ that is obtained by the measurement procedure shown in FIG. 4 and determined from the measurement results shown in FIG. 5, and $\alpha'$ is a value of the correction coefficient at the time of calculating a new correction coefficient $\alpha$. In one example, the function f is expressed by $\alpha=k1 \times S0+(\alpha'-k1 \times S0) \times \exp(-t/\tau 1)$ during irradiation, and $\alpha=\alpha' \times \exp(-t/\tau 1)$ during the left-standing period. The correction coefficient $\beta$ for correcting the relationship between the applied voltage of the light source 1 and the light amount detector 12 can also be expressed by the similar function system as that of the correction coefficient $\alpha$ by measuring the changes in the output ratio of the applied voltage of the light source 1 to the light amount detector 12 as set forth above. The measurement described above is not required to be performed frequently; it may be performed at, for example, a startup or maintenance of the apparatus.

In the example illustrated in FIG. 4 and FIG. 5, the method in which the coefficient k1 for the transmittance of the ND filter 20 in the illumination optical system 100 is calculated has been shown. However, the transmittance change of the optical system in the illumination optical system 100 and the energy applied to the projection optical system 10 during a unit time can be monitored by the light amount detector 12 also when the pulse energy or the oscillation frequency of the light source 1, or oscillation duty (the ratio of burst oscillation ON time to oscillation OFF time) is used as a parameter. Hence, the coefficient k1 and the time constant τ1 determined with respect to the output S0 of the light amount detector 12 can be used. It is obviously possible also to measure the changes in the output ratio of the light amount detector 12 to the irradiated light amount monitor 13 and to calculate the coefficient and the time constant individually, while changing the respective parameters independently.

In an actual exposure operation, the illumination extent of the reticle R and the transmittance of the reticle R change according to the type, layer, etc. of a device. This information regarding such a change cannot be monitored by the light amount detector 12. It is necessary, therefore, to separately calculate coefficients on the items affecting the amount of exposure light incident upon the optical members during a unit time by using the method illustrated in FIGS. 4 and 5. The calculation of the coefficients must be performed on the wafer W side rather than depending on the light amount detector 12. This is applied to the illumination extent of the reticle R defined by the masking blade 6 and the transmittance of the reticle R in the example of the exposure apparatus shown in FIG. 1. Hence, regarding the illumination extent A, the coefficient of the change in the output ratio of the light amount detector 12 to the irradiated light amount monitor 13 is denoted as k2, and the time constant is denoted as τ2 in order to individually determine this coefficient and time constant. Similarly, the coefficient of the change in the output ratio with respect to a transmittance RT of the reticle R is denoted as k3 and the time constant is denoted as τ3 to individually determine this coefficient and time constant. Then, the correction coefficient α of the gain of the light amount detector 12 is calculated by α=f (So, A, RT, k1, k2, k3, τ1, τ2, τ3, t, α'). The correction coefficient β is calculated in the same manner; however, the illumination extent of the reticle R defined by the masking blade 6 and the transmittance of the reticle R are not involved, so that these two parameters are excluded.

Referring back to FIGS. 1 and 2, in calculating the correction coefficients α and β, the light transmitting portion 14 on the reticle stage 9 is moved on the optical axis to measure the output ratio of the light amount detector 12 to the irradiated light amount monitor 13. The light transmitting portion 14, however, is dispensable. In an exposure apparatus without the light transmitting portion 14, if the reticle R is not retained, then a light amount can be measured by the irradiated light amount monitor 13 by utilizing a portion where the reticle R of the reticle stage 9 is rested. Furthermore, to measure a change in the transmittance of the projection optical system 10, using the transmittance of the reticle R as the parameter, if the reticle R itself has a light transmitting portion that can be measured by the irradiated light amount monitor 13, then the measurement can be performed by utilizing the light transmitting portion.

The descriptions will now be given of light amount setting and sensitivity correction in the scanning projection exposure apparatus shown in FIGS. 1 and 2.

First, a job for implementing exposure is loaded. At this time, conditions, such as an NA of the projection optical system 10, an illumination condition (σ value or modified illumination), and the extent of the masking blade 6, are also loaded. Based on the loaded illumination conditions, the size and shape of the aperture diaphragm 21 of the illumination optical system 100 are selected, and the masking blade 6 is driven so as to light-shield a predetermined area. At this time, based on the values of the correction coefficients α and β at the end of an immediately preceding exposure and the time elapsed from the end of the exposure, the main control system 104 calculates the correction coefficient α of the gain of the light amount detector 12 at that point and the correction coefficient β for correcting the relationship between the applied voltage of the light source 1 and the light amount detector 12. If a set light exposure is denoted as Ew(mJ/cm$^2$), the scan speed of the stage is denoted as V(cm/sec), and the slit width on the wafer W is denoted as d(cm), then a target output S0 per unit time of the light amount detector 12 is expressed as follows:

$$S0=(Ew \times d/V)/E \times S0ini/\alpha \tag{1}$$

The light amount computing unit 102 determines the oscillation conditions, such as the pulse energy and the oscillation frequency, of the light source 1 to obtain the target output S0 so as to determine the transmittance of the ND filter 20 in the illumination optical system 100. Based on a command from the light amount computing unit 102, the light amount control system 103 sets the applied voltage V of the light source 1 as shown below to obtain a desired pulse energy:

$$V=h \times \beta \times S0 \tag{2}$$

Thus, the light source 1 is energized at a predetermined oscillation frequency.

In actual exposure, the pulse energy of the light source 1 has predetermined energy variations. Hence, the target value S0 is slightly changed for each pulse in order to achieve a proper light exposure, and a command voltage applied to the light source 1 is changed according to expression (2).

Under the condition described above, the pattern of the reticle R is sequentially transferred onto the surface of the wafer W. Based primarily on the measurement results of the light amount detector 12, the main control system 104 constantly calculates a most up-to-date correction coefficient α of the gain according to the expression α=f (S0, A, RT, k1, k2, k3, τ1, τ2, τ3, t, α') at each preset timing. In the same manner, the correction coefficient β is also calculated. At this time, the oscillation condition of the light source 1 and the transmittance of the ND filter 20 are set using the most up-to-date correction coefficients a and β calculated by the main control system 104 such that the condition determined according to expression (1) is satisfied, then the exposure is performed. If the transmittance of the illumination optical system 100 or the projection optical system 10 changes, the applied voltage of the light source 1 that has been calculated to obtain a predetermined pulse energy may exceed a voltage permissible range that takes into account a variation allowance for controlling light exposure. In such a case, the voltage for the light source 1 is determined within a range wherein an appropriate voltage can be set, and based on an estimated value of pulse energy under the condition, the oscillation frequency of the light source 1 and the transmittance of the ND filter 20 are re-determined.

Thus, the above embodiment of the present invention has the reticle stage 9 that retains the reticle R and is movable in a direction orthogonal to an optical axis, a light transmitting portion 14 that allows exposure light to transmit at a place other than a transfer pattern, with the reticle R rested, and the irradiated light amount monitor 13 that is located in the vicinity of the wafer W and receives exposure light that has been transmitted through the transmitting portion 14. With this arrangement, the sensitivity of the light amount detector 12 in relation to the illuminance on the surface of the wafer W can be corrected while the reticle R is being retained, thus making it possible to restrain a drop in throughput. Moreover, the main control system 104 estimates a change in the transmittance from the information regarding an output of the light amount detector 12, the illumination extent, the transmittance of the reticle R, etc. Therefore, based on a change in the transmittance of the optical system, the proportional coefficient of an output of the light amount detector 12 and an emitted light amount of the light source 1 is corrected, and the sensitivity of the light amount detector 12 in relation to the illuminance on the surface of the wafer W is properly corrected. This arrangement provides an advantage in that a drop in throughput is restrained and proper light exposure control accuracy is securely maintained.

Obviously, the present invention is not limited to the embodiment set forth above, and can be implemented in a variety of modifications. For instance, within a range that would not cause a drop in throughput, based on the measurements of the output ratio of the irradiated light amount monitor 13 to the light amount detector 12, the method for correcting the sensitivity of the light amount detector 12 and the method for estimating sensitivity corrections shown in the embodiment may be used in combination. In this case, the correction coefficients α and β may be calculated based on the ratio of the outputs of the light amount detector 12 to the irradiated light amount monitor 13 that have passed through the transmitting portion 14 and have been measured, so that the main control system 104 may use the updated correction coefficients α and β, which have been obtained by the measurement, to perform the subsequent computation for estimation.

In the above embodiment of the present invention, the scanning exposure apparatus has been adopted as an example and described. The same advantages, however, can be expected also when the present invention is applied to a step-and-repeat type projection exposure apparatus (a "stepper"), or a contact or proximity exposure apparatus. In addition, the light source 1 may be any of a KrF excimer laser, an ArF excimer laser, an $F_2$ laser, or the like.

The descriptions will now be given of an embodiment of a manufacturing method for a semiconductor device by employing the projection exposure apparatus shown in FIG. 1.

Figure 6:
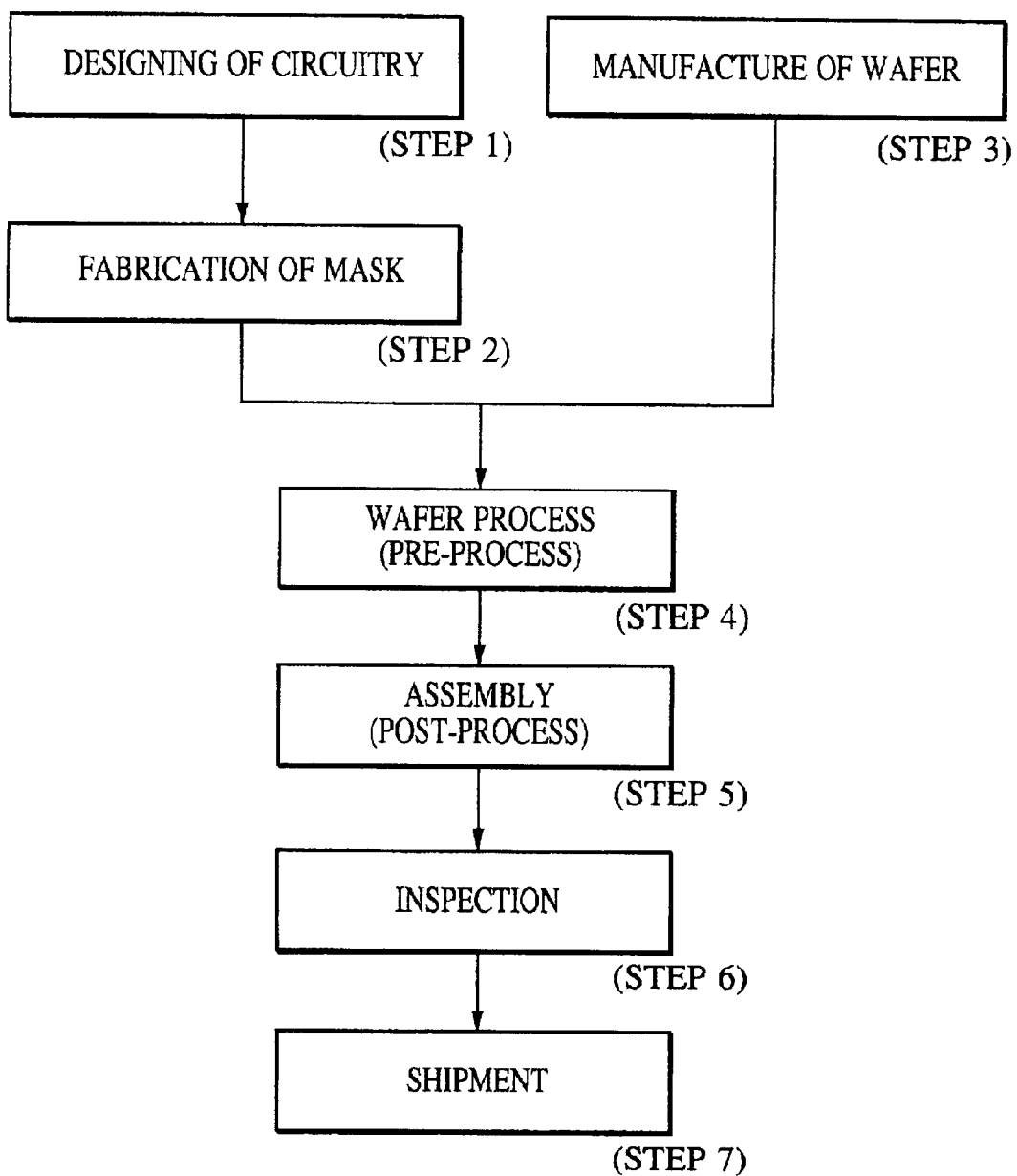
FIG. 6 is a flowchart showing a process of manufacturing a semiconductor device.

FIG. 6 is a flowchart showing a process for manufacturing semiconductor devices, including semiconductor chips, such as ICs or LSIs, liquid crystal panels, or CCDs. In step 1 for designing circuitry, the circuitry of a semiconductor device is designed. In step 2 for fabricating a mask, a mask or the reticle R on which a designed circuit pattern has been formed is produced. In step 3 for manufacturing wafers, wafers (wafers W) are manufactured using a material, such as silicon. Step 4, which is a wafer process, is known as a pre-process wherein an actual circuit is formed on the wafer by lithography, employing the prepared mask and wafer. The next step, step 5, which is an assembly step, is known as a post-process wherein a chip is made from the wafer created in step 4. Step 5 mainly includes an assembly step (dicing and bonding) and a packaging step (sealing chips). In step 6, which is an inspection step, the semiconductor devices created in step 5 are subjected to inspections that include an operation test, a durability test, etc. The semiconductor devices thus completed are then shipped in step 7.

Figure 7:
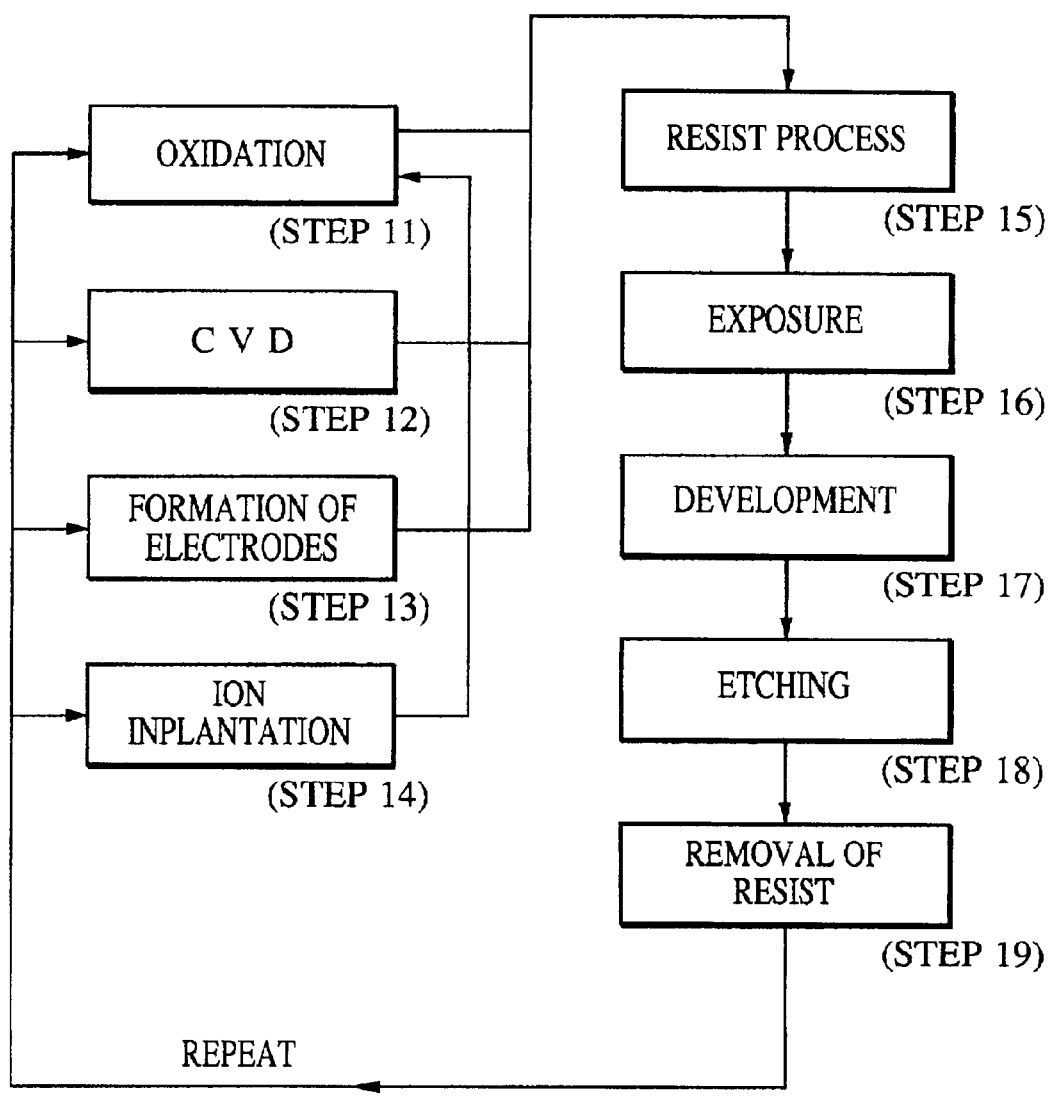
FIG. 7 is a flowchart illustrating the details of a wafer process in the manufacturing process shown in FIG. 6.

FIG. 7 shows a detailed flowchart of the aforesaid wafer process. In step 11 for oxidization, the surface of the wafer (wafer W) is oxidized. In step 12 for chemical vapor deposition (CVD), an insulating film is formed on the surface of the wafer. In step 13 for forming electrodes, electrodes are formed on the wafer by deposition. In step 14 for ion implantation, ions are implanted in the wafer. In step 15 for resist treatment, a resist or a sensitive material is applied to the wafer. In step 16 for exposure, the wafer is exposed using the image of the circuit pattern of the mask or the reticle R by the exposure apparatus. In step 17 for development, the exposed wafer is developed. In step 18 for etching, the portion excluding the developed resist area is removed. In step 19 for removing a resist, the resist portion that has become unnecessary after completion of etching is removed. By repeating the above series of steps, circuit patterns are formed on the wafer.

Employing the manufacturing method according to the embodiment permits easier manufacture of highly integrated semiconductor devices that used to be difficult to manufacture in the past.

As described above, based on an estimation result provided by a transmittance change estimating means for estimating a transmittance change of an optical system, the proportional coefficient of the output of a first photodetecting means and the amount of light emitted from a light source is corrected, or the sensitivity of the first photodetecting means in relation to the illuminance on a surface of a photosensitive substrate is corrected in addition to correcting the foregoing proportional coefficient. This allows the sensitivity of a light amount monitor to be accurately corrected, so that exposure can be performed with a proper light exposure.

Except as otherwise disclosed herein, the various components shown in outline or in block form in the figures are individually well known and their internal construction and operation are not critical either to the making or using of this invention or to a description of the best mode of the invention.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An exposure apparatus comprising:

a light source of a pulsed laser;

an illumination optical system illuminating an original on which a pattern is formed by exposure light emitted from said light source;

a projection optical system projecting the pattern to a photosensitive object;

a first photodetector disposed in a portion for receiving light from an optical path between said light source and a portion where the original is placed, said first photodetector being used for monitoring an emission light amount from said light source; and a processing system performing sensitivity correction of said first photodetector relative to information of a pulse energy of the light source, an oscillation frequency of the light source, a time of irradiating a pulsed laser light to said illumination optical system in said oscillation frequency, and a time when the pulsed laser light is not irradiated to said illumination optical system and is longer than a pulse period of said oscillation frequency.

2. An exposure apparatus according to claim 1, wherein said processing system further performs sensitivity correction of said first photodetector relative to an illuminance on a plane corresponding to a surface of the photosensitive object on the basis of the change of transmittance of at least an optical element between a position where light divided to said first photodetector and a photosensitive object.

3. An exposure apparatus according to claim 1, further comprising a stage movable in a direction orthogonal to an optical axis of said illumination optical system, on which the original is placed, and a second photodetector disposed near the photosensitive object, wherein said second photodetector detects the exposure light passing through a light transmitting portion of said stage placed at a position different from that of a portion where the pattern is positioned.

4. An exposure apparatus according to claim 1, wherein said light source includes one of a KrF excimer laser, an ArF excimer laser, and an F2 laser.

5. An apparatus according to claim 1, further comprising a second photodetector, disposed near the photosensitive object, having a light receiving surface positioned at the same height as a surface of the photosensitive object, wherein said processing system further performs sensitivity corrections of said first photodetector and said second photodetector on the basis of the changes in transmittance of at least an optical element between the position where light divided to said first photodetector and said second photodetector.

6. An exposure apparatus according to claim 1, wherein said processing system performs sensitivity correction on the basis of at least one of information regarding an illumination extent of said illumination optical system, and information regarding transmittance of the original.

* * * * *

UNITED STATES PATENT AND TRADEMARK OFFICE
CERTIFICATE OF CORRECTION

PATENT NO. : 6,744,492 B2  
DATED : June 1, 2004  
INVENTOR(S) : Kazuhiro Takahashi et al.

It is certified that error appears in the above-identified patent and that said Letters Patent is hereby corrected as shown below:

Drawings,  
Sheet 7, FIG. 7, (STEP 14), "INPLANTATION" should read -- IMPLANTATION --.

Column 7,  
Line 4, "coefficient 106," should read -- coefficient $\alpha$, --.

Column 8,  
Line 45, "coefficient a," should read -- coefficient $\alpha$ --.

Column 9,  
Line 18, "etc." should read -- etc., --.

Column 13,  
Line 11, "divided" should read -- is divided --.

Column 14,  
Line 12, "divided" should read -- is divided --.

Signed and Sealed this

First Day of February, 2005

JON W. DUDAS  
*Director of the United States Patent and Trademark Office*